(12) United States Patent
Zhuang et al.

(10) Patent No.: US 6,585,821 B1
(45) Date of Patent: Jul. 1, 2003

(54) METHOD OF MONITORING PGO SPIN-COATING PRECURSOR SOLUTION SYNTHESIS USING UV SPECTROSCOPY

(75) Inventors: Wei-Wei Zhuang, Vancouver, WA (US); Fengyan Zhang, Vancouver, WA (US); Jer-shen Maa, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/345,636

(22) Filed: Jan. 15, 2003

Related U.S. Application Data

(63) Continuation-in-part of application No. 09/822,637, filed on Mar. 30, 2001, now Pat. No. 6,537,361.

(51) Int. Cl.[7] .............................. C23C 16/16; B05D 5/12
(52) U.S. Cl. ........................... 106/287.19; 427/126.3; 427/255.35
(58) Field of Search ............... 106/287.19; 427/126.3, 427/255.35

(56) References Cited

U.S. PATENT DOCUMENTS

| | | | |
|---|---|---|---|
| 4,385,005 A | 5/1983 | Doyle | |
| 4,425,281 A | 1/1984 | Doyle | |
| 5,096,737 A | 3/1992 | Baum et al. | |
| 5,663,391 A | 9/1997 | Machida et al. | |
| 6,015,918 A | 1/2000 | Zhuang et al. | |
| 6,096,913 A | 8/2000 | Norman et al. | |
| 6,537,361 | * 3/2003 | Zhuang et al. | 106/287.19 |

OTHER PUBLICATIONS

Ismail, K., High Electron Mobility in Modulation–Doped Si/SiGe, American Institute of Physics, May 13, 1991, 58(19).
Lee, J.J., Processing of a uniaxial Ferroelectric $Pb_5Ge_3O_{11}$ Thin Film at 450° C. with C–axis Orientation, American Institute of Physics, May 18, 1992, 60(20).

* cited by examiner

*Primary Examiner*—David Brunsman
(74) *Attorney, Agent, or Firm*—David C. Ripma; Matthew D. Rabdau; Scott C. Krieger

(57) ABSTRACT

A method of monitoring the synthesis of a PGO spin-coating precursor solution includes monitoring heating of the solution with a UV spectrometer and terminating the heating step when a solution property reaches a predetermined value. The method utilizes the starting materials of lead acetate trihydrate ($Pb(OAc)_2.3H_2O$) and germanium alkoxide ($Ge(OR)_4$ ($R=C_2H_5$ and $CH(CH_3)_2$)). The organic solvent is di(ethylene glycol)ethyl ether. The mixed solution of lead and di(ethylene glycol)ethyl ether is heated in an atmosphere of air at a temperature no greater than 190° C., and preferably no greater than 185° C. for a time period in a range of approximately eighty-five minutes. During the heating step the solution properties are monitored to determine when the reaction is complete and when decomposition of the desired product begins to take place. The solution is then added to germanium di(ethylene glycol)ethyl ether to make the PGO spin-coating solution. This second step also entails heating the solution to a temperature no greater than 190° C. for a time period in a range of 0.5 to 2.0 hours. This heating step is also monitored with a UV spectrometer to determine when the heating step should be terminated. The process results in a PGO precursor solution suitable for use in spin-coating.

19 Claims, 3 Drawing Sheets

METHOD OF MONITORING PGO SPIN-COATING PRECURSOR SOLUTION SYNTHESIS USING UV SPECTROSCOPY

This application is a Continuation-in-Part of U.S. application Ser. No. 09/822,637 filed on Mar. 30, 2001, entitled METHOD OF THE SYNTHESIS AND CONTROL OF PGO SPIN-COATING PRECURSOR SOLUTIONS now U.S. Pat. No. 6,537,361.

FIELD OF THE INVENTION

This invention relates to integrated circuit fabrication and, more particularly, to a method of monitoring PGO spin-coating precursor solution synthesis using UV spectroscopy.

BACKGROUND OF THE INVENTION

Lead Germanium Oxide (PGO or $Pb_5Ge_3O_{11}$) thin films have broad application in ferroelectric 1T transistor devices. The methods of preparing PGO thin films include metal organic chemical vapor deposition (MOCVD), sputtering and spin-coating. For both MOCVD and sputtering methods, the thin film deposition processes are complex, and the equipment required is prohibitively expensive. Comparatively, the spin-coating technology is relatively simple and inexpensive.

The precursors for PGO ferroelectric thin film deposition are known in the art. The lead and germanium sources typically are lead acetate trihydrate ($Pb(OAc)_2.3H_2O$) and germanium alkoxide ($Ge(OR)_4$ (wherein $R=C_2H_5$ or $CH(CH_3)_2$)). The organic solvents are 2-methoxyethanol and di(ethylene glycol)ethyl ether (DEGEE). In the prior art synthesis route, the first step is normally the distillation of $Pb(OAc)_2.3H_2O$ in an organic solvent and then removal of the water. After mixing with the $Ge(OR)_4$ organic solution, the PGO solution is further heated in a di(ethylene glycol) ethyl ether solution. The PGO solution is not heated in the 2-methoxyethanol composition due to solid precipitation during the distillation. During heating in the di(ethylene glycol)ethyl ether, the PGO solution may gradually change to a black color. The heating temperature may be as high as 180° C. The PGO solution is believed to change to a black color when heated in Argon becuase black particles are believed to precipitate from the solution due to the reduction of Pb(2+).

According to Applicant's experiments, there are several disadvantages to the reported PGO spin-coating precursor solution preparation. First, the 2-methoxyethanol PGO solution is not stable in air and is moisture sensitive. Second, in the DEGEE solution, the presence of a black color signifies decomposition of the PGO solution, which involves the reduction of $Pb^{2+}$ to $Pb^+$ ($Pb_2O$). Third, monitoring the quality of the precursor is necessary. Therefore, problems remaining in the reported synthesis route include determining the correct PGO solution heat treatment method, determining the correct PGO precursor solution monitoring method, and determining the correct PGO solution spin-on property control method.

SUMMARY OF THE INVENTION

The present invention is directed toward providing a heat treatment method, controlling the properties of the synthesized solution, and monitoring the solution via UV spectroscopy so as to provide a suitable PGO spin-coating precursor solution. The method includes utilizing the starting materials of lead acetate trihydrate ($Pb(OAc)_2.3H_2O$) and germanium alkoxide ($Ge(OR)_4$ (wherein $R=C_2H_5$ or $CH(CH_3)_2$)). The organic solvent is di(ethylene glycol)ethyl ether (DEGEE). The mixed solution of $Pb(OAc)_2.3H_2O$ and DEGEE (the lead DEGEE solution) is heated in an atmosphere of air, not Argon, at a temperature no greater than 190° C., and preferably no greater than 185° C. for a time period in a range of thirty minutes to four hours, and preferably no greater than eighty-five minutes. The concentration of the solution typically is approximately 0.5 Normal. During the heating step the color of the solution is monitored by UV spectroscopy to determine when the reaction is complete and when decomposition of the desired reaction product begins to take place. A certain amount of DEGEE is then added into the lead DEGEE solution to adjust the solution to a desired lead concentration. To this lead DEGEE solution, a pre-mixed germanium DEGEE solution having a desired concentration is added to form a PGO precursor solution. The formed PGO precursor solution is then subjected to a second heating step of the process. This second step also entails heating the solution to a temperature no greater than 190° C. for a time period in a range of 0.5 to 2.0 hours in an air atmosphere. The process results in a PGO precursor solution, having a desired concentration, suitable for use in spin-coating processes.

Accordingly, an object of the invention is to provide a method of synthesizing PGO ferroelectric spin-coating solutions.

Another object of the invention is to provide a method of determining the correct PGO solution heat treatment method.

Still another object of the invention is to provide a method of monitoring PGO ferroelectric precursor spin-coating solutions using UV spectroscopy.

A further object of the invention is to provide a method of controlling the properties of a PGO spin-coating solution using UV spectroscopy.

DETAILED DESCRIPTION OF THE PREFERRED EMBODIMENTS

Figure 1:
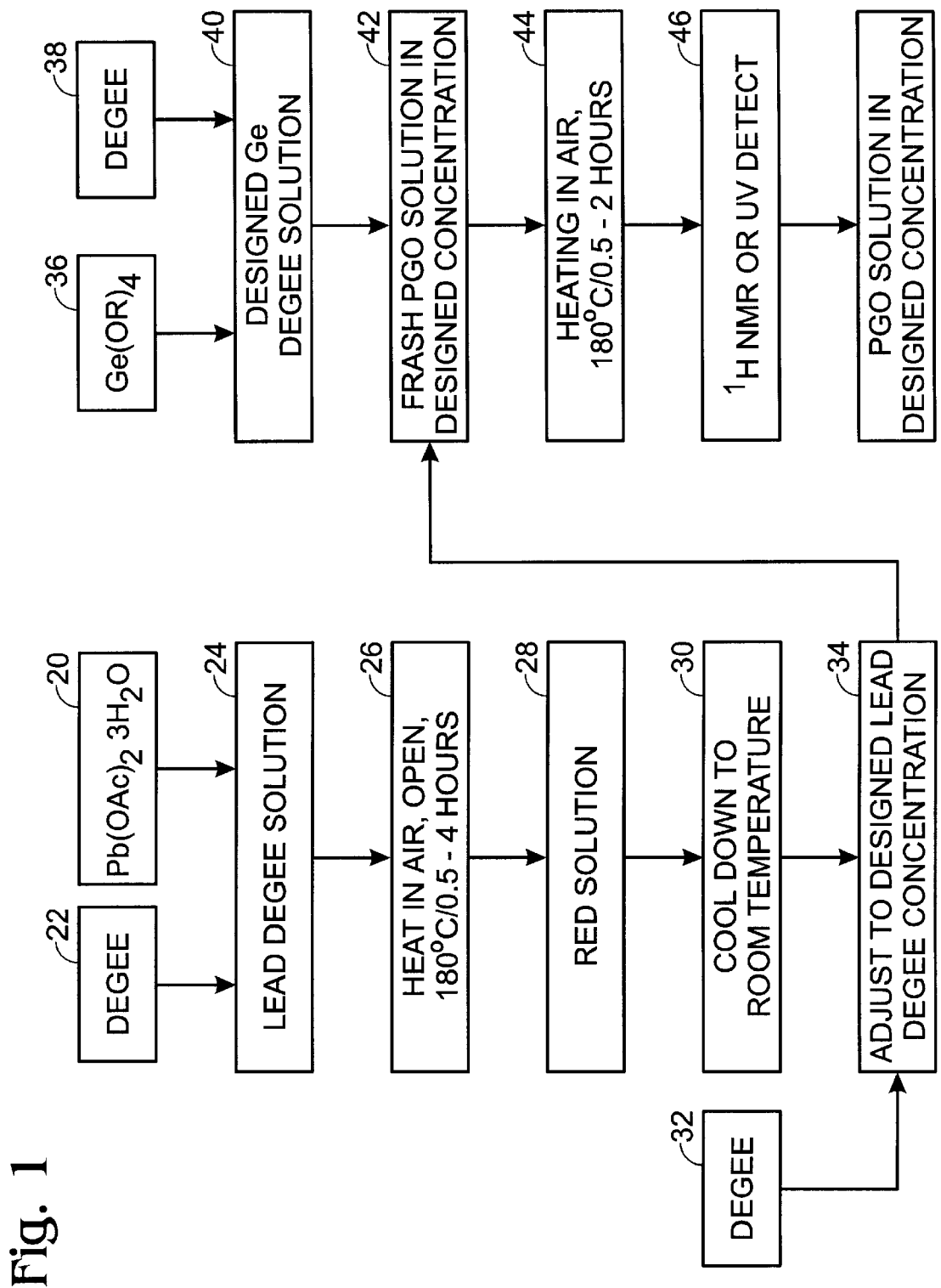
FIG. 1 is a flowchart of the synthesis procedures of the present invention.

The starting materials used in the synthesis of the present invention include lead acetate trihydrate ($Pb(OAc)_2.3H_2O$) and germanium alkoxide ($Ge(OR)_4$ (wherein $R=C_2H_5$ or $CH(CH_3)_3$)). The organic solvent is di(ethylene glycol)ethyl ether (DEGEE). The first step comprises heating the $Pb(OAc)_2.3H_2O$ in di(ethylene glycol)ethyl ether at a temperature in a range of 170 to 185° C. for a time period in a range of thirty minutes to four hours. The final lead concentration is adjusted to a designed, i.e., a desired, value by the addition of additional DEGEE after the solution is cooled down to room temperature. For example, one desired concentration of the lead DEGEE solution may be a concentration in a range of 0.4 to 0.6 Normal (0.4 to 0.6 N), and preferably at a concentration of 0.5 N.

According to a FTIR analysis conducted by Applicants, the water attached to the $Pb(OAc)_2$ and, therefore, was not completely removed. Accordingly, the lead experienced oxidation from $Pb^{2+}$ to $Pb^{2+}$–$Pb3^+$ ($Pb_3O_4$) if heated in air, or the reduction from $Pb^{2+}$ to $Pb^+$ if heated in an Argon (Ar) atmosphere. Overheating will cause decomposition of the compound and results in a large amount of brown solid being precipitated. Therefore, Applicants have determined that control of the $Pb(OAc)_2.3H_2O$ heating process is critical.

Initially, Applicants heated the $Pb(OAc)_2.3H_2O$ and di(ethylene glycol)ethyl ether (DEGEE) in Ar, and tried to distill off the water. The results indicated that some black solid precipitated from the solution. The black solid is believed to be the $Pb_2O$ from the reduction of $Pb(OAc)_2.3H_2O$. When the solution was exposed to air with stirring, the black solid then dissolved, which signifies the oxidation of $Pb_2O$ to $Pb^{2+}$. The solution then became unstable, and experienced gelatation with time. Thus, Applicants concluded that the heating process in an Argon atmosphere is not acceptable for the manufacture of PGO spin-coating solutions.

Applicants turned to a heating process conducted in an open atmosphere of air. Applicants found that the color of the solution gradually changed from a dilute yellow-brown to a deep red-brown with the appropriate time and temperature. In particular, the lead DEGEE solution was heated at a temperature in a range of 170 to 190° C. for a time period in a range of thirty minutes to four hours. The highest temperature preferably is 185° C. because above this temperature the compound may decompose rapidly. The resulting red-brown solution, without any decomposition of the lead solution, can be used to make the desired PGO spin-coating solutions.

In the second step of the process, a 0.5 N $Ge(OR)_4$ DEGEE solution is added into the lead DEGEE solution to make the desired PGO spin-coating precursor solution. The germanium DEGEE solution typically is prepared by mixing $Ge(OR)_4$ (wherein $R=C_2H_5$ or $CH(CH_3)_2$) and DEGEE to achieve a desired concentration, for example, a concentration in a range of 0.4 to 0.6 N, and preferably 0.5 N. The resulting PGO precursor solution must experience a heating treatment before use or the solution can not be spun well on a wafer surface. Incorrect spinning will result in a rough PGO film. Similar to the heating process of the lead solution, the heat treatment of the PGO mixed solution also experiences decomposition above a preferred temperature. Therefore, one must control the heating step so as to not overheat the solution, which will lead to decomposition, but at the same time one must heat the solution a sufficient amount so that the solution will meet the requirements for spin-coating. In particular, the PGO solution is subjected to a heating step at a temperature in a range of 170 to 185° C., for a time period in a range of 0.5 to 2.0 hours, and preferably less than eighty-five minutes. The heating preferably takes place in an air atmosphere. This will result in the solution being heated until it turns a deep red-brown color.

In particular, Applicants found in their $^1H$ NMR experiment that the decomposition of the PGO solution gave a clear peak at 3.15 ppm. Comparing this result to the results for the desired PGO precursor solutions, Applicants found that PGO thin films using good PGO solutions, i.e., non-decomposed solutions, show good hysteresis loops, while solutions using decomposed PGO solutions show poor hysteresis loops. Additionally, due to the color change of the solution, one may also use a UV spectrometer to detect the heat ending point, i.e., the preferred end point or upper temperature used in the second heating step.

The synthesis process is summarized in FIG. 1. Step 20 comprises providing lead acetate trihydrate. Step 22 comprises providing di(ethylene glycol)ethyl ether. Step 24 comprises mixing the two starting materials in a reaction vessel to form a lead di(ethylene glycol)ethyl ether solution. Step 26 comprises heating the solution in an open air atmosphere at a temperature in a range of 170 to 185° C., and preferably at a temperature of 180° C., for a time period in a range of thirty minutes to four hours. Step 28 comprises monitoring heating step 26 so as to determine when the solution is a deep red-brown color. At such a point, the heating step typically is terminated. Step 30 comprises cooling the solution down to room temperature, and preferably to a temperature of 25° C. Step 32 comprises providing di(ethylene glycol)ethyl ether. Step 34 comprises adding the di(ethylene glycol)ethyl ether of step 32 to the cooled solution of step 30. Step 34 results in a lead DEGEE solution having a desired concentration, for example, a concentration in a range of 0.4 to 0.6 Normal, and preferably having a concentration of 0.5 N.

Step 36 comprises providing germanium alkoxide ($Ge(OR)_4$ (where $R=C_2H_5$ or $CH(CH_3)_3$)). Step 38 comprises providing di(ethylene glycol)ethyl ether. Step 40 comprises forming a germanium DEGEE solution in a designed concentration, for example, a concentration in a range of 0.4 to 0.6 N, and preferably 0.5 N. Step 42 comprises adding the solution of step 40 to the lead di(ethylene glycol)ethyl ether solution of step 34 to form a PGO precursor solution. The PGO precursor solution may be considered "fresh" in that it has not been heated. The lead DEGEE and the germanium DEGEE typically are mixed in a molar ratio range of Pb:Ge of 5.0 to 5.5:3.0 to form the PGO precursor solution. Because lead has some volatility at high temperatures, a little extra lead is used in the preparation of the lead precursor. Step 44 comprises heating and monitoring the resulting PGO precursor solution until the solution is a deep red-brown color, whereupon the heating step is terminated. In particular, this typically comprises heating the solution in an air atmosphere at a temperature in a range of 170 to 185° C., and preferably at a temperature of 180° C., for a time period in a range of 0.5 to 2.0 hours. This will result in a PGO precursor solution having a desired concentration and being suitable for use in spin-coating. For example, the PGO precursor solution may have a concentration in a range of 0.4 to 0.6 Normal. Step 46 comprises conducting analytical tests to determine the composition of the resulting PGO precursor spin-coating solution, including $^1HNMR$ and/or UV detection methods. Step 46 may be conducted during heating step 44 so as to determine when the heating step should be ended, i.e., when the appropriate PGO precursor spin-coating solution has been created.

Turning now to the remaining figures, to control the PGo heating process, Applicants utilized Ultraviolet (UV) spectroscopy to monitor the precursor solution changes. The results are summarized in the figures described below. Essentially, there are three ways to monitor the PGO precursor heat-treatment process. The first process is to monitor the transmittance change (FIG. 2), the second is to monitor the refractive index change (FIG. 3), and the third is to monitor the absorption index change (FIG. 4). For each of these figures, the PGO precursor solution was continuously heated at 185° C. for three hours, and the UV spectrometer recorded the filtration effect on the precursor solutions. Because the precipitated particles were removed after the filtration, the transmittance was increased. Thus, these figures show the changes in the precursor solutions during heat treatment.

Figure 2:
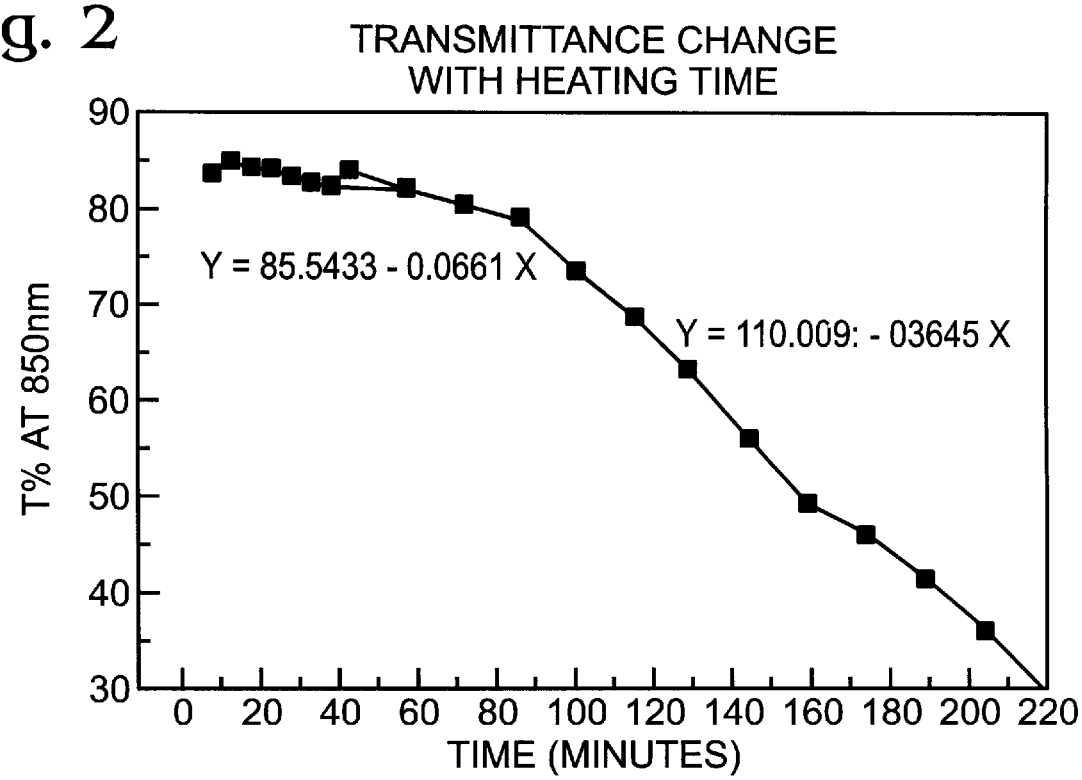
FIG. 2 is a graph of the transmittance change with heating time for the synthesis process of the present invention.
Figure 3:
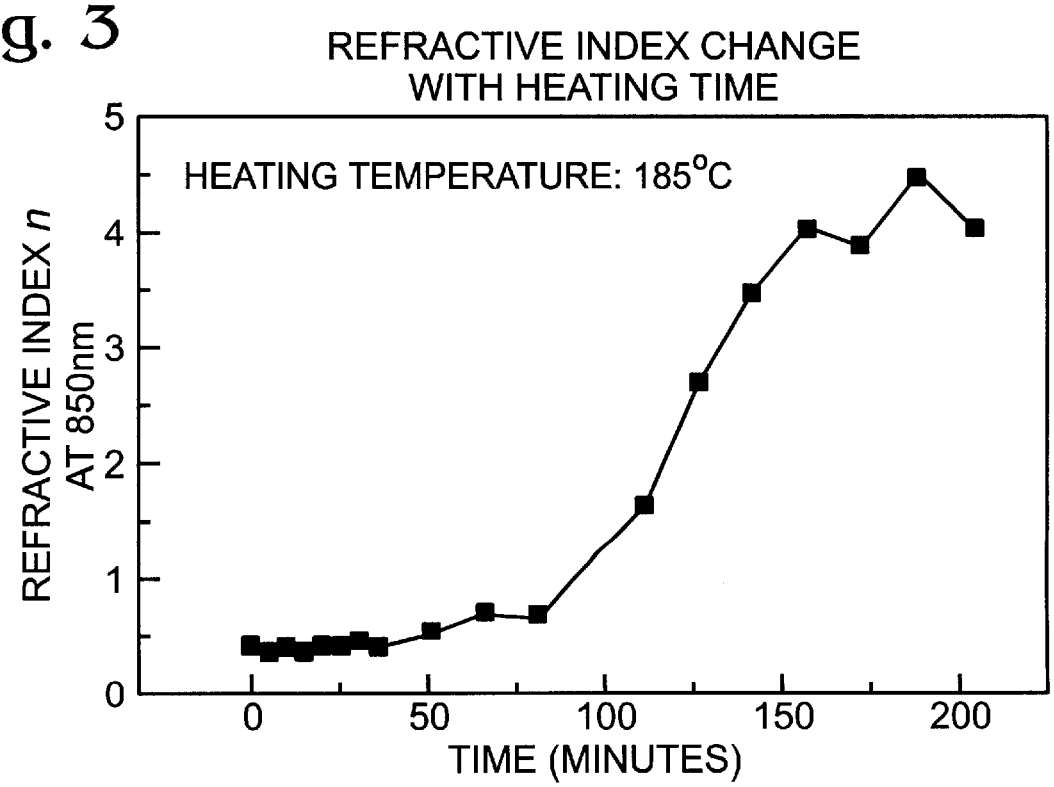
FIG. 3 is a graph of the refractive index change with heating time for the synthesis process of the present invention.
Figure 4:
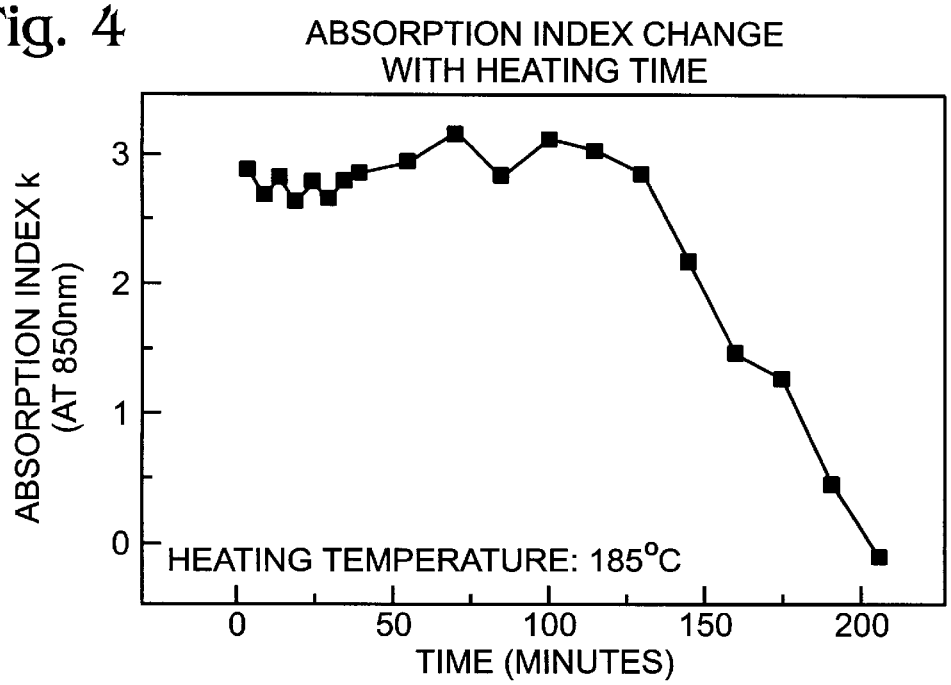
FIG. 4 is a graph of the absorption index change with heating time for the synthesis process of the present invention.

In general, viewing FIGS. 2–4, it is shown that in the first heat stage, less than eight-five minutes, the heating improves the PGO precursor solution properties for spin-coating. In contrast, in the second stage, after heating for eighty-five minutes, the heating starts to destroy the precursor due to decomposition. Thus, Applicants conclude that UV monitoring is an effective method to control the PGO precursor solution heat-treatment process. In particular, we now turn to the figures.

FIG. 2 is a graph of the percentage transmittance change with heating time for the synthesis process of the present invention. For the first heating stage, a time less than eighty-five minutes, the percentage transmittance change with heating time follows Equation 1:

$$Y = 85.5433 - 0.0661X \quad \text{Equation 1:}$$

For the second heating state, time greater than eighty-five minutes, the percentage transmittance change with heating time follows Equation 2:

$$Y = 110.0091 - 0.3645X \quad \text{Equation 2:}$$

Thus, UV spectroscopy shows that the transmittance is drastically reduced after heating for eighty-five minutes.

FIG. 3 is a graph of the refractive index change with heating time for the synthesis process of the present invention. The graph shows the refractive index n at 850 nm for a heating temperature of 185° C. As shown in the graph, the refractive index is relatively steady at approximately 0.5 during the first heating stage, i.e., during the first eighty-five minutes of heating. After heating for approximately eighty-five minutes, the refractive index of the solution is seen to increase dramatically from approximately 0.5 to 4.0.

FIG. 4 is a graph of the absorption index change with heating time for the synthesis process of the present invention. The graph shows the absorption index k at 850 nm for a heating temperature of 185° C. As shown in the graph, the absorption index is relatively steady at approximately 2.7 during the first heating stage, i.e., during the first eighty-five minutes of heating. After heating for approximately eighty-five minutes, the absorption index of the solution is seen to decrease dramatically from approximately 2.7 to zero at approximately two hundred minutes. Accordingly, UV spectroscopy can be used to monitor the solution during heating wherein the heating step is preferably terminated just as the absorption index deops below approximately 2.7. In other examples, the heating step may be terminated when the absorpiton index drops below 2.0 or 2.5.

Figure 5:
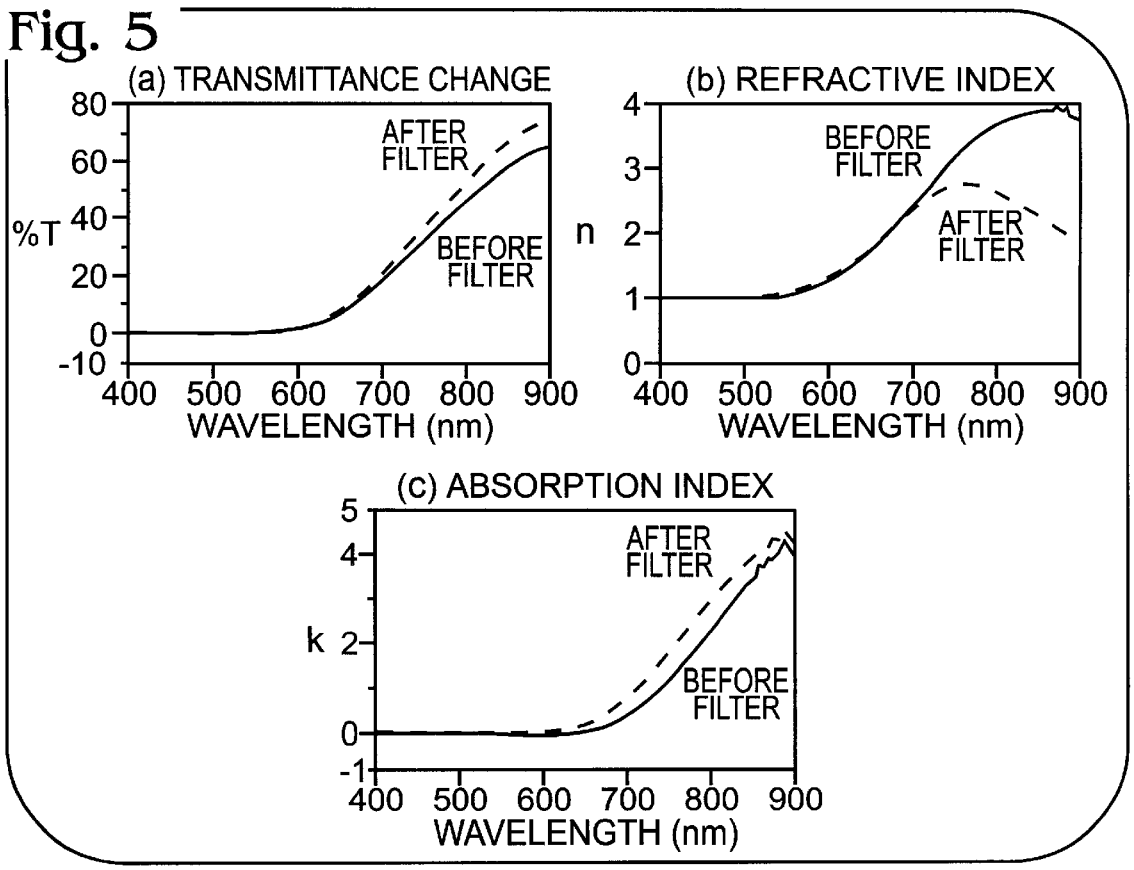
FIGS. 5A–5C are graphs showing UV spectroscopy changes before and after filtration.

FIGS. 5A–5C are graphs showing UV spectroscopy changes before and after filtration. FIG. 5A shows the percentage transmittance versus wavelength (in nm) before filtration (solid line) and after filtration (dash line). The percent trasmittance is shown to be higher after filtration for wavelengths greater than approximately 700 nm. FIG. 5B shows the refractive index n versus wavelength (in nm) before filtration (solid line) and after filtration (dash line). The refractive index is show to be lower after filtration for wavelengths greater than approximately 700 nm. FIG. 5C shows the absorption index k versus wavelength (in nm) before filtration (solid line) and after filtration (dash line). The absorption index is shown to be higher after filtration for wavelengths greater than approximately 700 nm. FIGS. 5A–5C were obtained using a solution heated at 185° C. for three hours which contained some small decomposed particles. Accordingly, these figures show the existence of these non-visible small decomposed particles.

Thus, a method of monitoring the synthesis of a PGO precursor spin-coating solution using UV spectroscopy has been disclosed. Although preferred methods of monitoring the solution have been disclosed, it should be appreciated that further variations and modifications may be made thereto without departing from the scope of the invention as defined in the appended claims.

We claim:

1. A method of monitoring the synthesis of a PGO spin-coating precursor solution comprising the steps of:
   providing lead acetate trihydrate;
   providing di(ethylene glycol)ethyl ether;
   mixing said lead acetate trihydrate and said di(ethylene glycol)ethyl ether to form a lead di(ethylene glycol) ethyl ether solution;
   heating the lead di(ethylene glycol)ethyl ether solution in an open air atmosphere at a temperature in a range of 170 to 190° C.;
   during said heating step, monitoring the solution with a UV spectrometer so as to monitor a change in an absorption index of the solution; and
   terminating said heating step when said absorption index reaches a predetermined value.

2. The method of claim 1 wherein said predetermined value is 2.0, and wherein said heating step is terminated when said absorption index falls below 2.0.

3. The method of claim 1 wherein said heating step is terminated after a time period of eighty-five minutes.

4. The method of claim 1 wherein said step of heating the lead di(ethylene glycol)ethyl ether solution in an open air atmosphere is conducted at a temperature in a range of 184 to 186° C.

5. The method of claim 1 further comprising cooling the lead di(ethylene glycol)ethyl ether solution down to a room temperature.

6. The method of claim 5 further comprising adding di(ethylene glycol)ethyl ether to the lead di(ethylene glycol) ethyl ether solution to form a lead DEGEE solution having a concentration in a range of 0.4 to 0.6 Normal.

7. The method of claim 6 further comprising mixing germanium alkoxide $(Ge(OR)_4)$ wherein R is chosen from the group consisting of $C_2H_5$ and $CH(CH_3)_2$, and di(ethylene glycol)ethyl ether to form a germanium DEGEE solution having a concentration in a range of 0.4 to 0.6 Normal.

8. The method of claim 7 further comprising mixing said lead di(ethylene glycol)ethyl ether solution and said germanium DEGEE solution to form a precursor solution.

9. The method of claim 8 further comprising heating said precursor solution, monitoring said precursor solution with a UV spectrometer so as to monitor a change in the absorption index, and terminating said heating step when said absorption index reaches said predetermined value.

10. The method of claim 9 wherein said step of heating said precursor solution comprises heating the precursor solution in an air atmosphere at a temperature in a range of 170 to 185° C., for a time period in a range of 0.5 to 2.0 hours, so as to provide a PGO precursor solution suitable for use in spin-coating.

11. The method of claim 10 wherein said PGO precursor solution has a concentration in a range of 0.4 to 0.6 Normal.

12. The method of claim 10 wherein said step of heating said precursor solution is terminated when said absorption index falls below 2.0.

13. The method of claim 10 where said step of heating said precursor solution is terminated after a time period of eighty-five minutes.

14. A method of monitoring a PGO spin-coating precursor solution comprising the steps of:
- providing lead acetate trihydrate;
- providing di(ethylene glycol)ethyl ether;
- mixing said lead acetate trihydrate and said di(ethylene glycol)ethyl ether to form a lead di(ethylene glycol) ethyl ether solution;
- heating the lead di(ethylene glycol)ethyl ether solution in an open air atmosphere;
- during said heating step, monitoring the solution with a UV spectrometer so as to monitor a change in an absorpiton index of the solution; and
- terminating said heating step when said absorption index reaches a predetermined value.

15. The method of claim 14 wherein said heating step is terminated when said absorption index falls below 2.5.

16. The method of claim 14 wherein said heating step is terminated after a time period of ninety minutes.

17. The method of claim 14 further comprising:
- cooling the lead di(ethylene glycol)ethyl ether solution down to a temperature of 25° C.;
- adding di(ethylene glycol)ethyl ether to the lead di(ethylene glycol)ethyl ether solution to form a lead di(ethylene glycol)ethyl ether solution having a concentration in range of 0.4 to 0.6 Normal;
- adding germanium alkoxide $(Ge(OR)_4)$ wherein R is chosen from the group consisting of $C_2H_5$ and $CH(CH_3)_3$, to di(ethylene glycol)ethyl ether to form a germanium di(ethylene glycol)ethyl ether solution having a concentration in a range of 0.4 to 0.6 Normal;
- adding said lead di(ethylene glycol)ethyl ether solution to said germanium di(ethylene glycol)ethyl ether solution to form a precursor solution;
- heating said precursor solution;
- during said step of heating said precursor solution, monitoring the precursor solution with a UV spectrometer so as to monitor a change in a precursor solution property; and
- terminating said step of heating said precursor solution when said precursor solution property reaches a predetermined value.

18. The method of claim 17 wherein said step of heating said precursor solution is terminated when said absorption index falls below 2.0.

19. The method of claim 14 wherein said step of heating said precursor solution is terminated after a time period of eighty minutes.

* * * * *